US012609702B2

(12) United States Patent
Chinthu et al.

(10) Patent No.: US 12,609,702 B2
(45) Date of Patent: Apr. 21, 2026

(54) VOLTAGE LEVEL DOWN-SHIFTING CIRCUIT STRUCTURE WITH INPUT STAGE PULL-DOWN CAPACITOR

(71) Applicant: GlobalFoundries U.S. Inc., Malta, NY (US)

(72) Inventors: Siva Kumar Chinthu, Bangalore (IN); Palle Sundar Veerendranath, Bangalore (IN); Vivek Sharma, Bangalore (IN); Saumya Kumari Diwedi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 34 days.

(21) Appl. No.: 18/749,829

(22) Filed: Jun. 21, 2024

(65) Prior Publication Data

US 2025/0392311 A1 Dec. 25, 2025

(51) Int. Cl.
*H03K 19/0185* (2006.01)
*H10D 1/66* (2025.01)
*H10D 30/65* (2025.01)

(52) U.S. Cl.
CPC ....... *H03K 19/018521* (2013.01); *H10D 1/66* (2025.01); *H10D 30/657* (2025.01)

(58) Field of Classification Search
CPC . H03K 19/018521; H10D 1/66; H10D 30/657
See application file for complete search history.

(56) References Cited

U.S. PATENT DOCUMENTS

| | | | |
|---|---|---|---|
| 7,061,298 B2 | 6/2006 | Mentze et al. | |
| 2004/0189371 A1* | 9/2004 | Correale, Jr. .... | H03K 19/01714 |
| | | | 327/333 |

(Continued)

FOREIGN PATENT DOCUMENTS

| | | |
|---|---|---|
| CN | 114531148 A | 5/2022 |

OTHER PUBLICATIONS

Karimi et al., "A Reconfigurable Single-supply Multiple-level Down-shifter for System-on-Chip Applications," 2021 IEEE International Symposium on Circuits and Systems (ISCAS), downloaded May 30, 2024, 5 pages.

(Continued)

*Primary Examiner* — Patrick O'Neill
(74) *Attorney, Agent, or Firm* — David Cain; Hoffman Warnick LLC

(57) ABSTRACT

A voltage level shifter includes an input stage with series-connected first and second N-type field effect transistors (NFETs) and an output stage with an inverter connected to an intermediate node between the first and second NFETs. Gates of the first and second NFETs are connected to an output node of the inverter and an input node, respectively. An input voltage signal on the input node toggles between a first voltage and ground. An intermediate voltage signal on the intermediate node toggles between a second voltage (lower than the first voltage) and ground. An output voltage signal on the output node toggles between the second voltage and ground. A capacitor in the input stage is connected between the input and intermediate nodes so that, when the input voltage switches to ground, the intermediate voltage signal is pulled to ground to facilitate switching of the output voltage signal to the second voltage.

20 Claims, 5 Drawing Sheets

(56)          References Cited

U.S. PATENT DOCUMENTS

| 2007/0170465 | A1 | | 7/2007 | Kwon et al. |
| 2011/0260753 | A1 | | 10/2011 | Srivastava et al. |
| 2018/0342948 | A1* | 11/2018 | Lin ........................ H10D 1/66 |
| 2022/0038101 | A1 | | 2/2022 | Bogi et al. |

OTHER PUBLICATIONS

Ker et al., "Design of 2 x VDD—Tolerant I/O Bugger With PVT Compensation Realized by Only 1 x VDD Thin-Oxide Devices," IEEE Transactions on Circuits and Systems I: Regular Papers, vol. 60, No. 10, Oct. 2013, 12 pages.
Zheng et al., "Capacitive Floating Level Shifter: Modeling and Design," 2015 IEEE, downloaded May 30, 2024, 6 pages.
European Search Report for corresponding EP Application No. 24217343.3-1201 dated Jun. 2, 2025, 18 pages.

* cited by examiner

VOLTAGE LEVEL DOWN-SHIFTING CIRCUIT STRUCTURE WITH INPUT STAGE PULL-DOWN CAPACITOR

BACKGROUND

Embodiments disclosed herein relate to voltage level shifters and, more particularly, to embodiments of a voltage level down-shifter.

Considerations in modern integrated circuit (IC) design include, but are not limited to, performance improvement, size scaling, and power consumption. Oftentimes design changes to improve one aspect of an IC or component thereof can yield an undesirable trade-off with respect to other aspects of the IC or component. For example, a voltage level down-shifter may be incorporated into an IC to shift a received high-power signal to a low-power signal for subsequent processing. Designs for such voltage level down-shifters have been developed that include low voltage transistors for reduced power consumption. However, at least some of the low voltage transistors in these voltage level down-shifters may operate outside their safe operating areas (SOAs). Design modifications intended to avoid SOA violations have included, for example, the use of asymmetric high voltage transistors (e.g., laterally diffused metal oxide semiconductor field effect transistors (LDMOSFETs)) in place of at-risk low voltage transistors and/or the use of static bias circuits. However, these design modifications typically add to circuit complexity, power consumption, and area.

SUMMARY

Disclosed herein are embodiments of a circuit structure and, more particularly, a voltage level shifting circuit. Generally, in the disclosed embodiments, the voltage level shifting circuit can include an input stage and an output stage. The input stage can include a first transistor and a second transistor connected in series. The first transistor can have a first gate and the second transistor can have a second gate. Additionally, the input stage can include an intermediate node, which is between the first transistor and the second transistor, and an input node, which is connected to the second gate of the second transistor and which is further connected to receive a voltage input signal that switches between a first voltage and ground.

Finally, the input stage can include a capacitor, which is connected to the input node and to the intermediate node. The output stage can include an inverter, which is connected to the intermediate node to receive an intermediate voltage signal and which has an output node that outputs an output voltage signal. This output voltage signal can be inverted with respect to the intermediate voltage signal and can switch between ground and a second voltage that is different from the first voltage (as the input voltage signal switches between the first voltage and ground and vice versa). The output node can further be connected to the first gate of the first transistor.

Some embodiments of the voltage level shifting circuit can include an input stage and an output stage. The input stage can include a first transistor and a second transistor connected in series. The first transistor can have a first front gate and the second transistor can have a second front gate. Additionally, the input stage can include an intermediate node, which is between the first transistor and the second transistor, and an input node, which is connected to the second front gate of the second transistor and which is further connected to receive an input voltage signal that switches between a first positive voltage and ground. Finally, the input stage can include a capacitor, which is connected to the input node and to the intermediate node. The output stage can include an inverter, which is connected to the intermediate node to receive an intermediate voltage signal and which has an output node that outputs an output voltage signal. This output voltage signal can be inverted with respect to the intermediate voltage signal and can switch between ground and a second positive voltage that is lower than the first positive voltage (as the input voltage signal switches between the first positive voltage and ground and vice versa).

Other embodiments of the voltage level shifting circuit can include an input stage and an output stage. The input stage can include a first N-type field effect transistor (NFET) and a second NFET connected in series between a ground rail and a positive supply voltage rail. The first NFET can have a first front gate and the second NFET can have a second front gate. Additionally, the input stage can include an intermediate node, which is between the first NFET and the second NFET, and an input node, which is connected to the second front gate of the second NFET and which is further connected to receive an input voltage signal that switches between a first positive voltage and ground. It should be noted that the positive supply voltage rail can be at a second positive voltage, which is lower than the first positive voltage. Finally, the input stage can further include a capacitor, which is connected to the input node and to the intermediate node. The output stage can include an inverter. This inverter can include a third NFET and a P-type field effect transistor (PFET), which are also connected in series between the ground rail and the positive supply voltage rail. The third NFET can have a third front gate connected to the intermediate node to receive an intermediate voltage signal and the PFET can have a fourth gate connected to the intermediate node to receive the same intermediate voltage signal. The inverter can further have an output node, which is between the third NFET and the PFET and which outputs an output voltage signal. This output voltage signal can be inverted with respect to the intermediate voltage signal and can switch between ground and the second positive voltage (as the input voltage signal switches between the first positive voltage and ground and vice versa).

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
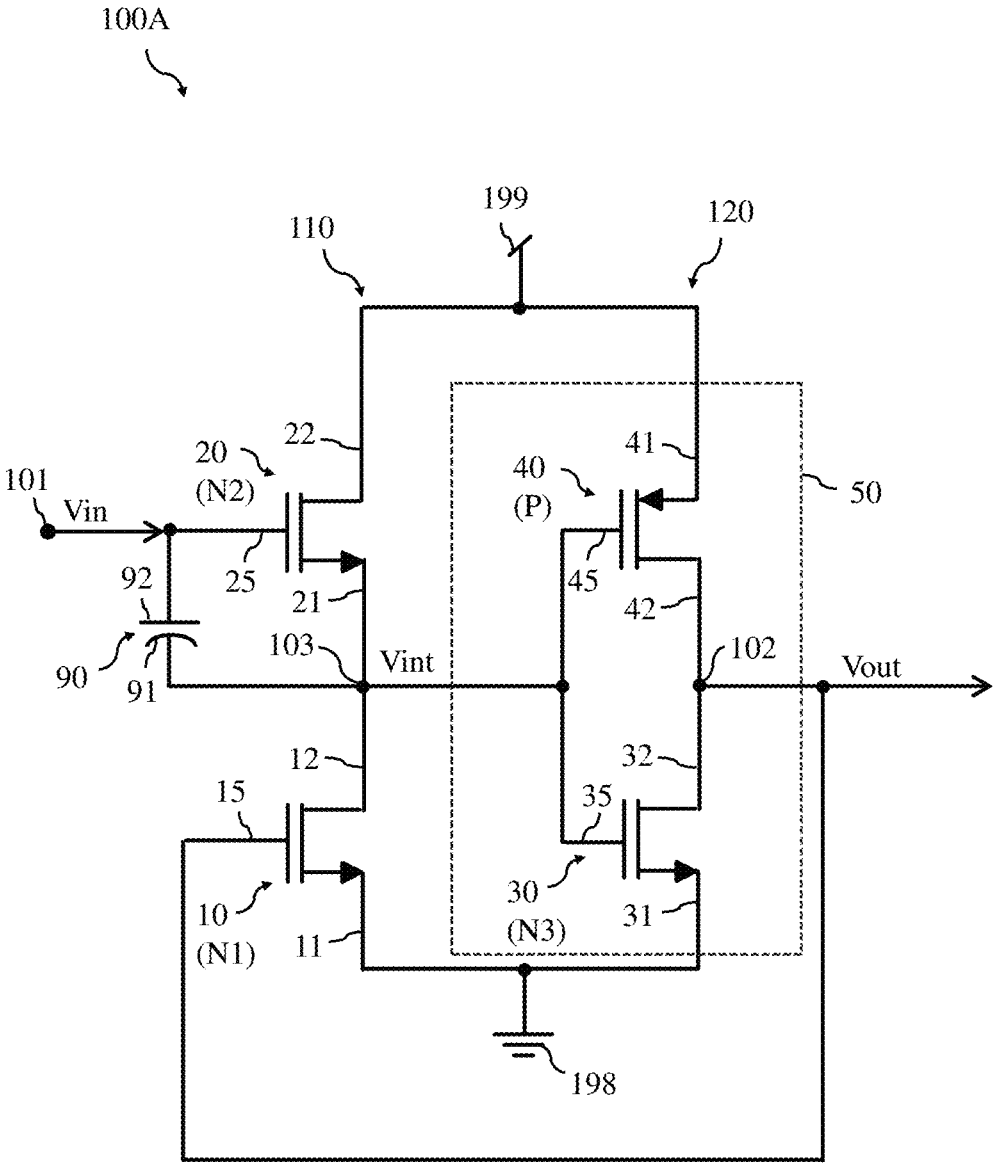
FIG. 1A is a schematic diagram illustrating a disclosed embodiment of a voltage level shifting circuit structure.

As mentioned above, considerations in modern integrated circuit (IC) design include, but are not limited to, performance improvement, size scaling, and power consumption. Oftentimes design changes to improve one aspect of an IC or component thereof can yield an undesirable trade-off with respect to other aspects of the IC or component. For example, a voltage level down-shifter may be incorporated into an IC to shift a received high-power signal to a low-power signal for subsequent processing. Designs for such voltage level down-shifters have been developed that include low voltage transistors for reduced power consumption. However, at least some of the low voltage transistors in these voltage level down-shifters tend to quickly operate outside their safe operating areas (SOAs). Design modifications intended to avoid SOA violations have included, for example, the use of asymmetric high voltage transistors (e.g., laterally diffused metal oxide semiconductor field effect transistors (LDMOSFETs)) in place of at-risk low voltage transistors and/or the use of static bias circuits. However, these design modifications typically add to circuit complexity, power consumption, and area.

In view of the foregoing, disclosed herein embodiments of a structure and, particularly, a voltage level down-shifting circuit structure including all low voltage transistors that continuously operate within their specified SOAs and further including, within an input stage, a pull-down capacitor to facilitate output voltage signal switching in an output stage. More particularly, the structure can include an input stage with series-connected first and second transistors (e.g., series-connected first and second N-type field effect transistors (NFETs)). The structure can further include an output stage including an inverter, which is connected to an intermediate node between the first and second transistors and which has an output node. Front gates of the first and second transistors in the input stage can be connected to the output node and an input node, respectively. An input voltage signal on the input node can toggle between a first voltage and ground. As a result, an intermediate voltage signal on the intermediate node can toggle between a second voltage (which is different from and, particularly, lower than the first voltage) and ground. An output voltage signal on the output node is inverted with respect to the intermediate voltage signal and can toggle between ground and the second voltage (as the input voltage signal toggles between the first voltage and ground and vice versa). The input stage can also include a pull-down capacitor, which has one plate connected to the input node and another plate connected to the intermediate node. This pull-down capacitor ensures that, when the input voltage signal switches from the first voltage to ground, the intermediate voltage signal on the intermediate node is also pulled down to ground (as opposed to being left floating) in order to facilitate switching of the output voltage signal on the output node from ground to the second voltage.

Figure 1B:
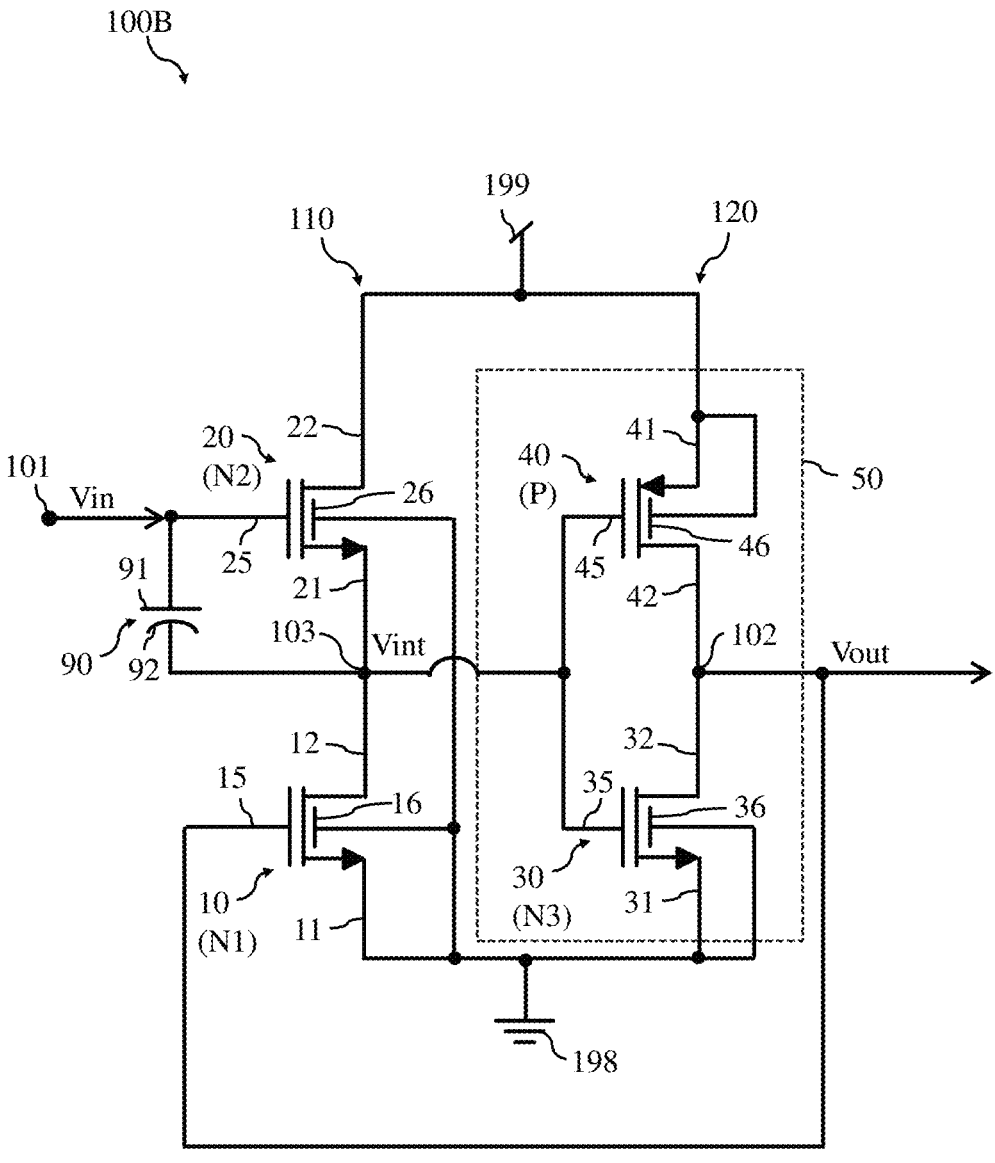
FIG. 1B is a schematic diagram illustrating another disclosed embodiment of a voltage level shifting circuit structure.

More particularly, FIGS. 1A-1B are schematic diagrams illustrating embodiments of a voltage level down-shifting circuit structure 100A-100B, respectively (also referred to herein as the structure, the voltage level shifting circuit, the voltage level shifter or the voltage level down-shifter).

As discussed in greater detail below, structure(s) 100A, 100B can include multiple transistors (including a first transistor 10, a second transistor 20, a third transistor 30 and a fourth transistor 40). Transistors 10, 20, 30, 40 can be, for example, field effect transistors (FETs). Those skilled in the art will recognize that a FET is a transistor structure that includes a channel region between source/drain regions. FETs can be N-type FETs (NFETs) or P-type FETs (PFETs). Those skilled in the art will also recognize that, in an NFET, the source/drain regions can be N-type source/drain regions at a relatively high conductivity level (e.g., can be N+ source/drain regions) and the channel region can be either an intrinsic (i.e., undoped) channel region or a P-type channel region at a relatively low conductivity level (e.g., a P-channel region). In a PFET, the source/drain regions can be P-type source/drain regions at a relatively high conductivity level (e.g., can be P+ source/drain regions) and the channel region can be either an intrinsic (i.e., undoped) channel region or an N-type channel region at a relatively low conductivity level (e.g., an N-channel region). In any case, a FET can include at least one gate structure adjacent to the channel region. Various FET structures including, but not limited to, planar or non-planar FET structures and single-gate or multi-gate FET structures are well known in the art and could be incorporated into a voltage level down-shifting circuit structure, as disclosed herein. FIG. 1A is a schematic diagram illustrating a structure 100A that includes only single-gate FET structures. The single-gate FETs of structure 100A of FIG. 1A could have any suitable single-gate FET configuration. Since various different single-gate FET configurations are well known in the art, the specific details thereof have been omitted from this specification in order to allow the reader to focus on the salient aspects of the disclosed embodiments related to the voltage level down-shifting circuit structure. FIG. 1B is a schematic diagram illustrating a structure 100B that includes dual-gated FET structures. The dual-gated FETs of structure 100B of FIG. 1B could similarly have any suitable dual-gated FET configuration.

Figure 2:
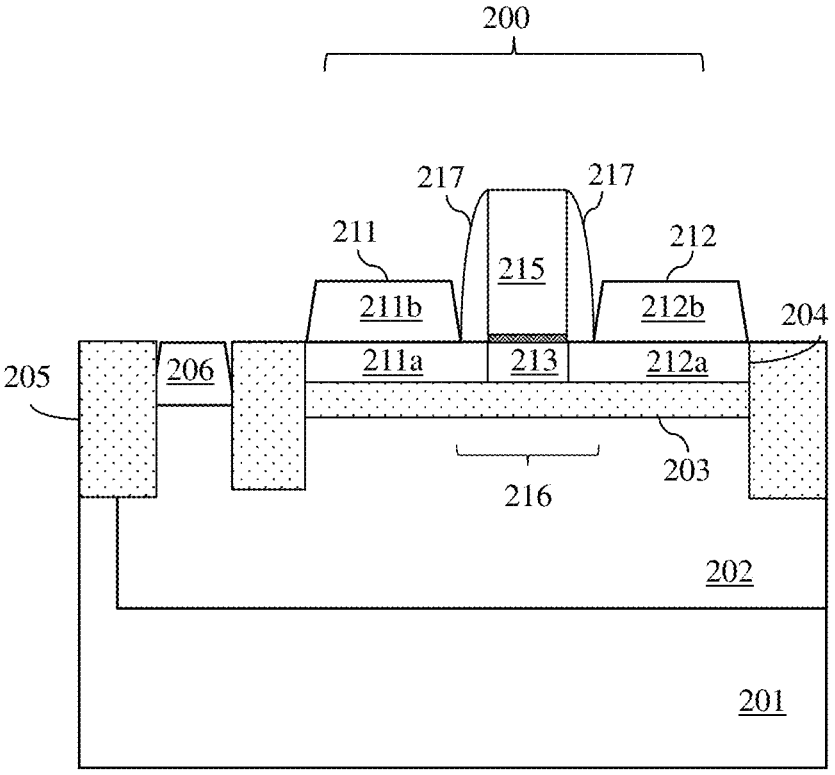
FIG. 2 is a cross-section diagram illustrating an example of a dual-gated transistor that could be incorporated in the voltage level shifting circuit structure of FIG. 1B.

FIG. 2 is a cross-section diagram illustrating an example of a dual-gated FET 200 (hereinafter referred to as FET 200) that could be employed for transistors 10, 20, 30, and 40 in structure 100B of FIG. 1B. FET 200 can be formed using an advanced semiconductor-on-insulator technology processing platform. That is, this FET 200 can be a semiconductor-on-insulator FET (e.g., silicon-on-insulator (SOI) FET), such as either a fully-depleted semiconductor-on-insulator FET (e.g., a fully-depleted SOI (FDSOI) FET) or a partially-depleted semiconductor-on-insulator FET (e.g., a partially-depleted SOI (PDSOI) FET).

Referring to FIG. 2, a semiconductor substrate 201 can be, for example, a monocrystalline silicon substrate or, alternatively, a monocrystalline substrate of any other suitable semiconductor material (e.g., silicon germanium, etc.). An insulator layer 203 can be on the top surface of semiconductor substrate 201. Insulator layer 203 can be, for example, a silicon dioxide layer or a layer of any other suitable insulator material. A semiconductor layer 204 can be on the top surface of insulator layer 203. Semiconductor layer 204 can be, for example, a monocrystalline silicon layer or a layer of any other suitable monocrystalline semiconductor material (e.g., silicon germanium, etc.).

Trench isolation regions 205 (e.g., shallow trench isolation (STI) structures) can define active device region(s) for one or more FETs 200 within semiconductor layer 204 and can electrically isolate FET 200 from other devices, as necessary. Such STI structures can include, for example, one or more trenches patterned (e.g., lithographically) and etched so as to extend vertically from the top surface of semiconductor layer 204 to (and optionally through) insulator layer 203. The trench(es) can be filled with one or more layers of isolation materials (e.g., silicon dioxide, silicon nitride, silicon oxynitride, etc.), thereby forming the STI structures.

FET 200 can include, within its active device region, a channel region 213 positioned laterally between a source region 211 and a drain region 212. Source/drain regions 211-212 can include lower source/drain portions 211a-212a including doped regions of semiconductor layer 204 on either side of channel region 213. Optionally, source/drain regions 211-212 can further include upper source/drain portions 211b-212b (also referred to herein as raised source/drain regions) above and immediately adjacent to lower source/drain portions 211a-212a, respectively. Upper source/drain portions 211b-212b can include epitaxially grown monocrystalline semiconductor layers (e.g., epitaxially grown silicon layers). As discussed above, in an NFET, source/drain regions 211-212 can be N+ source/drain regions and channel region 213 can be either an intrinsic channel region or a P-channel region. In a PFET, source/drain regions 211-212 can be P+ source/drain regions and channel region 213 can be either an intrinsic channel region or a N-channel region.

FET 200 can further include a front gate 215 (also referred to herein as a primary gate) adjacent to (e.g., above, and immediately adjacent to) the active device region at channel region 213. Front gate 215 can include a gate dielectric layer (including one or more layers of gate dielectric material) immediately adjacent to channel region 13 and a gate conductor layer (including one or more layers of gate conductor material) on the gate dielectric layer. Front gate 215 could be any of a gate-first polysilicon gate structure, a gate-first high-K metal gate (HKMG) structure, a gate-last HKMG structure (also referred to as a replacement metal gate (RMG) structure), or any other suitable type of front gate structure. Gate sidewall spacers 217 can further be positioned laterally adjacent to sidewalls of front gate 215 to electrically isolate it from the adjacent source/drain regions 211-212. Front gate structures with gate sidewall spacers are well known in the art and, thus, the details thereof have been omitted from the specification in order to allow the reader to focus on the salient aspects of the disclosed embodiments.

FET 200 can further include a back gate 216 (also referred to herein as a secondary gate). Specifically, semiconductor substrate 201 can include a well region 202 therein. Well region 202 can be located at the top surface of semiconductor substrate 201 immediately adjacent insulator layer 203 and can further be aligned below the active device region. For purposes of this disclosure, a well region refers to a region of semiconductor material doped (e.g., via a dopant implantation process or any other suitable doping process) so as to have a particular conductivity type.

Those skilled in the art will recognize that one advantage of advanced semiconductor-on-insulator technology processing platforms is that FETs can be formed on an insulator layer above either a particular type of well region (e.g., an N-type well region (Nwell) or a P-type well region (Pwell)) in order to achieve different types of NFETs or PFETs with different threshold voltages (VTs). For example, for a super low threshold voltage (SLVT) or low threshold voltage (LVT) FET, an NFET can be formed above an Nwell and a PFET can be formed above a Pwell. For a regular threshold voltage (RVT) or high threshold voltage (HVT) FET, an NFET can be formed above a Pwell and a PFET can be formed above an Nwell. Typically, a circuit block will include all SLVT (or LVT) FETs with NFETs above Nwells and PFETs above Pwells or all RVT (or HVT) FETs with NFETs above Pwells and PFETs above Nwells. Whether the FETs are SLVT or LVT FETs or whether they are RVT or HVT FETs will depend upon the design (e.g., device size, etc.) and process specifications (e.g., dopant concentrations, etc.). In structure 100B of FIG. 1B, all transistors can be, for example, SLVT or LVT transistors. That is, any NFET within structure 100B (and described in greater detail below) can be aligned above an Nwell, whereas any PFET can be aligned above a Pwell.

Another advantage of advanced semiconductor-on-insulator technology processing platforms is that portions of the insulator layer and well regions aligned below a FET effectively form a back gate, which can be biased (referred to as back gate biasing or back-biasing) to fine tune the threshold voltage. Forward back-biasing (FBB) refers to applying a gate bias voltage to the back gate (particularly, to the well region thereof) to reduce the VT of the FET. Reverse back-biasing (RBB) refers specifically to applying a gate bias voltage to the back gate (particularly, to the well region thereof) to increase the VT of the FET, thereby decreasing the switching speed and reducing leakage current. Thus, in FET 200, portions of insulator layer 203 and well region 202 aligned below channel region 213 effectively form a back gate 216. To facilitate back gate biasing, FET 200 can include a well contact region 206 (also referred to herein as a well tap). Specifically, the structure can further include a bulk region (also referred to as a hybrid region). This bulk region can be devoid of insulator layer 203 and instead can include well contact region 206 at the top surface of semiconductor substrate 201 immediately adjacent to well region 202, and electrically isolated from the active device region by STI structures.

Well contact region 206 can include, for example, an epitaxial monocrystalline semiconductor layer (e.g., an epitaxial silicon layer or an epitaxial layer of any other suitable semiconductor material), which is grown on the top surface of semiconductor substrate 201 immediately adjacent to well region 202 and either in situ doped or subsequently implanted so as to have the same type conductivity but at a higher conductivity level than the well region below. Alternatively, well contact region 206 could be a highly doped region within and at the top surface of well region 202. Given the above-described structure, front gate 215 and back gate 216 of FET 200 are independently biasable. That is, they can be biased with the same bias voltage or different bias voltages. Back biasing of the dual-gated transistors in structure 100B of FIG. 1B is discussed in greater detail below. It should be understood that the example dual-gated FET shown in FIG. 2 is just one type of dual-gated FET that could be incorporated into structure 100B. Alternatively, any other type of dual-gated FET having independently biasable front and back gates (i.e., primary and secondary gates) could be incorporated into structure 100B.

In any case all of the transistors 10, 20, 30, and 40 of structure 100A, 100B can be low voltage transistors for reduced power consumption. For example, transistors 10, 20, 30, and 40 can all be 1.8 volts (V)-rated transistors, 1.5 V-rated transistors or transistors with some other relatively low voltage rating. Those skilled in the art will recognize that FETs typically have a technology-specified safe operating area (SOA). The technology-specified SOA includes several maximum operating voltage conditions including, but not limited to, a maximum gate-source voltage (VGSmax), a maximum drain-gate voltage (VDGmax), and a maximum drain-source voltage (VSDmax). Transistors 10, 20, 30, and 40 can be symmetric transistors with the same VGSmax, VDGmax, and VDSmax. For example, if the transistors are 1.8 V-rated transistors, VGSmax, VDGmax, and VDSmax could all be approximately equal to the absolute value of 1.8 V) (e.g., at the absolute value of 1.98 V). If the transistors are 1.5 V-rated transistors, VGSmax, VDGmax, and VDSmax could all be approximately equal to the absolute value of 1.5 V (e.g., at the absolute value of 1.65 V), and so on.

Referring again to FIGS. 1A and 1B, structure 100A, 100B can include an input stage 110. Input stage 110 can include a first transistor and, particularly, a first N-type field effect transistor (NFET)) 10 and a second transistor and, particularly, a second NFET 20, which are connected in series between a ground rail 198 (e.g., at 0.0 V) and a positive supply voltage rail 199. More specifically, first NFET 10 can include: a first source region 11, which is electrically connected to ground rail 198; a first drain region 12; and a first channel region between first source region 11 and first drain region 12. First NFET 10 can further include either a first gate 15 adjacent to the first channel region (as illustrated in structure 100A of FIG. 1A) or a first front gate 15 and a first back gate 16 on opposite sides of the first channel region (as illustrated in the structure 100B of FIG. 1B). Second NFET 20 can include: a second source region 21, which is electrically connected to first drain region 12 of first NFET 10; a second drain region 22, which is electrically connected to positive supply voltage rail 199; and a second channel region between second source region 21 and second drain region 22. Second NFET 20 can further include a second gate 25 adjacent to the second channel region (as illustrated in structure 100A of FIG. 1A) or a second front gate 25 and a second back gate 26 on opposite sides of the first channel region (as illustrated in structure 100B of FIG. 1B). As discussed above, the source/drain regions of such NFETs can be N+ source drain regions and the channel regions can be either intrinsic (i.e., undoped) or P-channel regions.

Input stage 110 can further include an intermediate node 103 at the junction or electrical connection between the first drain region 12 of first NFET 10 and second source region 21 of second NFET 20. Input stage 110 can further include an input node 101. This input node 101 can be connected to receive a voltage input signal (Vin) that requires voltage level down-shifting. Vin can toggle between (i.e., switch between) a first positive voltage (V1) and ground (e.g., 0.0 V). It should be noted that the positive supply voltage rail 199 can be at a second positive voltage (V2) that is less than the first positive voltage (V1). For example, in embodiments where transistors 10, 20, 30, and 40 are all 1.8 V-rated transistors, V2 can be 1.8 V and V1 can be less than or equal to 3.6 V. In embodiments where transistors 10, 20, 30, and 40 are all 1.5-rated transistors, V2 can be 1.5 V and V1 can be less than or equal to 3.0 V, and so on. Input node 101 can further be connected to second gate 25 (or, if applicable, second front gate 25 as in structure 100B of FIG. 1B) of second NFET 20. Thus, Vin controls the on/off stage of second NFET 20.

Figure 3:
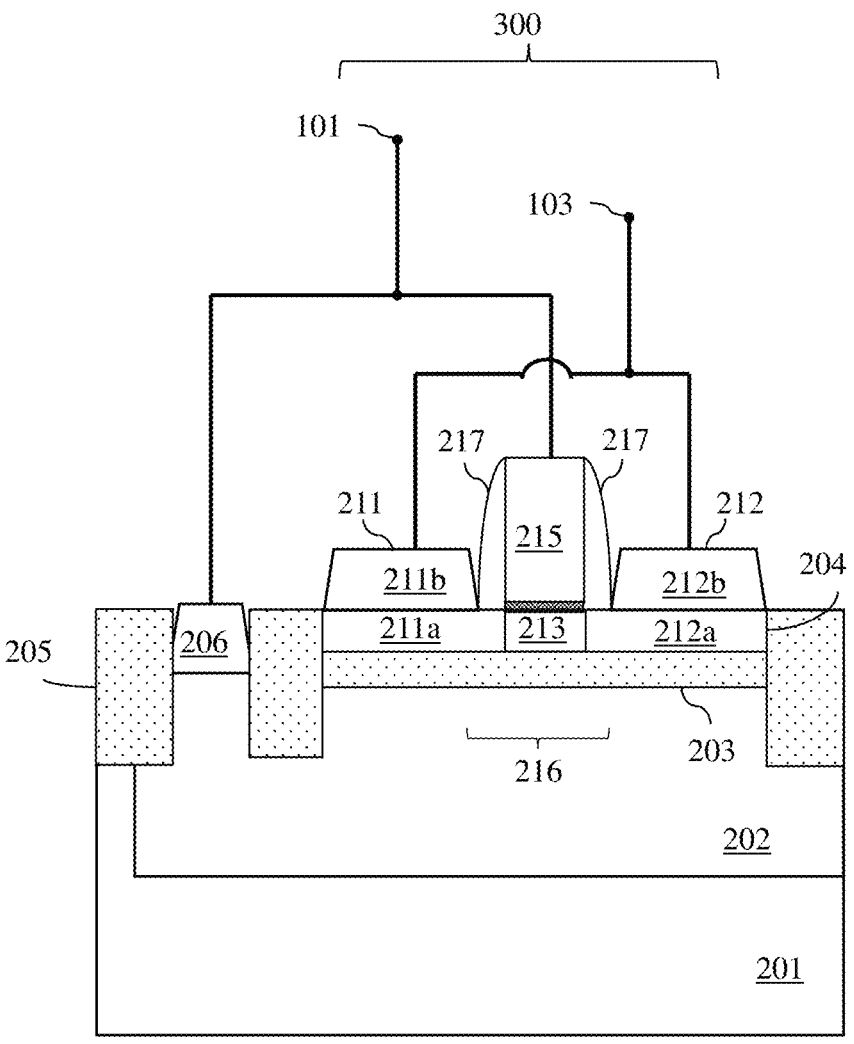
FIG. 3 is a cross-section diagram illustrating an example of a capacitor that could be incorporated in the voltage level shifting circuit structure of FIG. 1B.

Input stage 110 can further include a pull-down capacitor 90 connected to input node 101 and to intermediate node 103. Specifically, pull-down capacitor 90 can include: a first capacitor plate 91, which connected to input node 101; a second capacitor plate 92, which is connected to intermediate node 103; and a capacitor dielectric between the first and second capacitor plates 91-92. Various different capacitor structures are well known in the art (e.g., metal-oxide-metal capacitors (MOMCAPs), metal-insulator-metal capacitors (MIMCAPs), metal oxide semiconductor capacitors (MOSCAPs), etc.) and any such capacitor could be incorporated into structure 100A, 100B as pull-down capacitor 90. For example, in structure 100B of FIG. 1B, pull-down capacitor 90 could optionally include a semiconductor-on-insulator NFET with appropriate electrical connections to convert the NFET into a MOSCAP 300, as shown in FIG. 3. Specifically, MOSCAP 300 can include an NFET configured in essentially the same manner as FET 200 of FIG. 2, described in detail above. In this case, however, front and back gates 215 and 216 can be electrically connected to each other (effectively forming first capacitor plate 91) and further electrically connected to input node 101. Additionally, source region 211 and drain region 212 can be electrically connected to each other (effectively forming second capacitor plate 92) and can further be electrically connected to intermediate node 103. Capacitor 90 could, for example, have a capacitance value ranging from approximately 10 femtofarads (fF) or less to approximately 40 fF or more.

Structure 100A, 100B can also include an output stage 120. Output stage 120 can further include an inverter 50, which has an input connected to intermediate node 103 and which has an output node 102. Specifically, inverter 50 can include a third transistor and, particularly, a third NFET 30 and a fourth transistor and, particularly, a P-type field effect transistor (PFET) 40, which are connected in series between the ground rail 198 (e.g., at 0.0 V) and the positive supply voltage rail 199 at V2. More specifically, third NFET 30 can include: a third source region 31, which is electrically connected to ground rail 198; a third drain region 32; and a third channel region between third source region 31 and third drain region 32. Third NFET 30 can further include either a third gate 35 adjacent to the third channel region (as illustrated in structure 100A of FIG. 1A) or a third front gate 35 and a third back gate 36 on opposite sides of the third channel region (as illustrated in structure 100B of FIG. 1B). As discussed above, source/drain regions of such an NFET can be N+ source/drain regions and the channel region can be either an intrinsic (i.e., undoped) channel region or a P-channel region. PFET 40 can include: a fourth drain region 42, which is electrically connected to third drain region 32 of third NFET 30; a fourth source region 41, which is electrically connected to the positive supply voltage rail 199; and a fourth channel region between fourth source region 41 and fourth drain region 42. PFET 40 can further include a fourth gate 45 adjacent to the fourth channel region (as illustrated in structure 100A of FIG. 1A) or a fourth front gate 45 and a fourth back gate 46 on opposite sides of the fourth channel region (as illustrated in structure 100B of FIG. 1B). As discussed above, source/drain regions of such a PFET can be P+ source/drain regions and the channel region can be either an intrinsic (i.e., undoped) channel region or an N-channel region.

In inverter 50, third gate 35 of third NFET 30 and fourth gate 45 of PFET 40 (or, if applicable, third front gate 35 and fourth front gate 45 as in structure 100B of FIG. 1B) can be electrically connected to intermediate node 103. Inverter 50 can further include an output node 102 at the electric connection between third drain region 32 of third NFET 30 and fourth drain region 42 of PFET 40. Output node 102 can further be electrically connected to first gate 15 of first NFET 10 in input stage 110 (or, if applicable, to first front gate 15 as in structure 100B of FIG. 1B).

It should be noted that, in structure 100B of FIG. 1B (where first NFET 10 includes a first back gate 16, second NFET 20 includes a second back gate 26, third NFET 30 includes a third back gate 36, and PFET 40 includes a fourth back gate 46) all transistors 10, 20, 30, and 40 can be configured as LVT transistors or SLVT transistors. That is, first NFET 10, second NFET 20, and third NFET 30 can be above Nwell(s) and PFET 40 can be above a Pwell so that the threshold voltages (VTs) of these transistors are relatively low. Additionally, back gate biasing can be performed. For example, first back gate 16 of first NFET 10, second back gate 26 of second NFET 20, and third back gate 36 of third NFET 30 can all be electrically connected to ground rail 198 for back gate biasing with 0.0V. Contrarily, fourth back gate 46 of PFET 40 can be electrically connected to the positive supply voltage rail 199 for back gate biasing with V2 (e.g., 1.8 V).

In structure 100A, 100B, any two or more of the transistors (i.e., first NFET 10, second NFET 20, third NFET 30 and fourth NFET 40) could be the same size or could be different sizes. In some embodiments, second NFET 20 can specifically be larger than first NFET 10, third NFET 30 and PFET 40. For example, second NFET 20 could have a longer channel width and a longer channel length than first NFET 10, third NFET 30 and PFET 40. In some embodiments, first NFET 10 and PFET 40 could be same size transistors. That is, they could have the same channel width and the same channel length. In some embodiments, third NFET 30 could be smaller than first NFET 10 and PFET 40. For example, third NFET 30 could have a longer channel width, but the same channel length as first NFET 10 and PFET 40. In some embodiments, first NFET 10 could have a 1000 nanometer (nm) channel width and a 150 nm channel length, second NFET 20 could have a 3000 nm channel width and a 500 nm channel length, third NFET 30 could have a 500 nm channel width and a 150 nm channel length, and PFET 40 could have a 1000 nm channel width and a 150 nm channel length.

During operation of structure 100A of FIG. 1A or 100B of FIG. 1B, when Vin toggles from ground to V1 (e.g., 3.6 V), second NFET 20 will turn on, thereby pulling up an intermediate voltage signal (Vint) on intermediate node 103 from ground to V2 (e.g., 1.8 V). As a result, 1.8V is applied to gates 35 and 45 of third NFET 30 and PFET 40 of inverter 50, thereby turning on third NFET 30 and turning off PFET 40. As a result, Vout at output node 102 is pulled down to ground (e.g., 0.0V). When Vout switches to ground, first NFET 10 turns off, thereby ensuring that Vint on intermediate node 103 remains at V2 and Vout on output node 102 remains at ground until Vin at input node 101 switches again.

When Vin toggles from V1 (e.g., 3.6V) back to ground (e.g., 0.0V), second NFET 20 will turn off. If not for capacitor 90, Vint on intermediate node 103 would be left floating and Vout on output node 102 would not switch. However, as mentioned above, capacitor 90 includes a first capacitor plate 91 connected to input node 101 and a second capacitor plate 92 connected to intermediate node 103. So, when Vint on intermediate node 103 is at V2 (e.g., 1.8 V) but Vin at input node 101 switches to ground, current will flow through capacitor 90, thereby pulling down Vint on intermediate node 103 toward ground. As a result, third NFET 30 turns off and PFET 40 turns on, thereby pulling up Vout at output node 102 to V2 (e.g., 1.8 V). With Vout at V2 (e.g., 1.8 V), first NFET 10 turns on, thereby maintaining Vint on intermediate node 103 at ground until Vin at input node 101 again switches back to V1 (e.g., 3.6 V).

Figure 4:
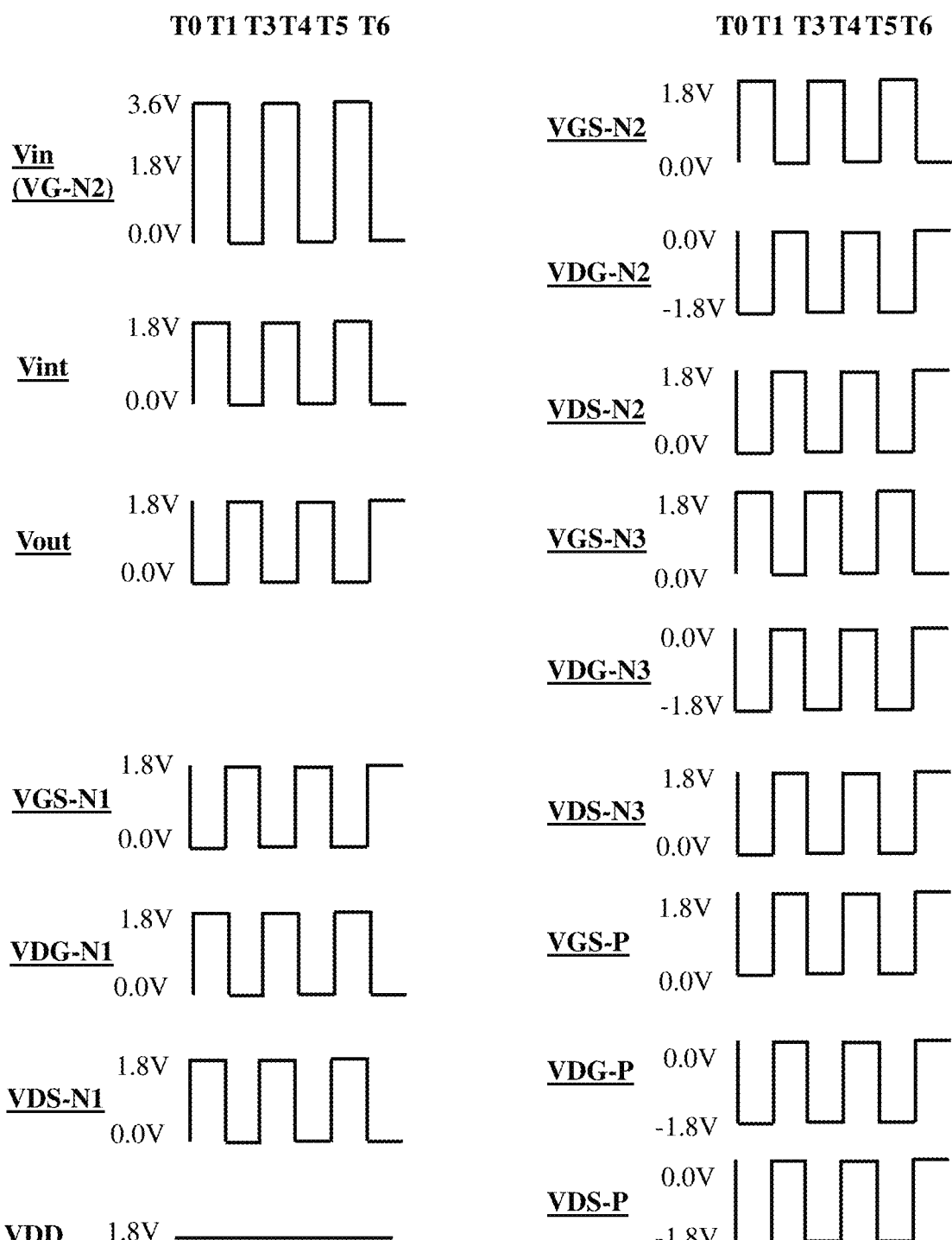
FIG. 4 is a timing diagram illustrating various voltages associated with voltage level shifting operations in an example voltage level shifting circuit structure.

FIG. 4 is a timing diagram illustrating various voltages associated with voltage level down-shifting operations performed by an example structure 100A or 100B, as described above, where all transistors are 1.8 V-rated transistors, where VGSmax, VDGmax and VDSmax are all 1.98V, where the first positive voltage (V1) is 3.6 V, and the second positive voltage (V2) is 1.8 V. As illustrated, when Vin on input node 101 rises to 3.6 V, Vint on intermediate node 103 will rise to 1.8 V, and Vout on output node 102 will fall to 0.0 V. However, when Vin on input node 101 drops back to 0.0 V, Vint on intermediate node 103 will also drop to 0.0 V, and Vout on output node 102 will rise to 1.8 V. Whether Vin at input node 101 is at 3.6 V or at 0.0 V, all of the transistors 10, 20, 30, and 40 will remain within their SOA. That is, with this configuration, VGS, VDG and VDS of each transistor is generally no greater than the absolute value of 1.8 V so none of the transistors 10, 20, 30 or 40 exhibits a violation of VGSmax, VDGmax and VDSmax.

Techniques for forming various different types of FETs (including single-gate FETs or multi-gate FETs, such as FDSOI FETs or PDSOI FETs or the like) on a substrate and for forming interconnects (e.g., middle of the line (MOL) contacts and/or back end of the line (BEOL) wires and/or vias) that will electrically such FETs in a particular manner to each other, to voltage rails, to signal nodes, etc. are known in the art. Thus, the details of these techniques have been omitted from the specification in order to allow the reader to focus on the salient aspects of the disclosed voltage level down-shifting circuit structure embodiments (e.g., structure 100A of FIG. 1A or 100B of FIG. 1B, as described in detail above).

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a voltage level down-shifting circuit connected to receive a voltage input signal at a single input node and operable to output an output voltage signal at a single output node,
wherein the voltage input signal switches between a first voltage and ground and the output voltage signal switches between a second voltage that is less than the first voltage and ground,
wherein the voltage level down-shifting circuit includes a single input stage including:
a first transistor having a first gate;
a second transistor having a second gate, wherein the first transistor and the second transistor are connected in series;
an intermediate node between the first transistor and the second transistor;
the single input node further connected to the second gate; and
a capacitor connected to the single input node and to the intermediate node, wherein the capacitor pulls down an intermediate voltage signal on the intermediate node from the second voltage to ground when the input voltage signal switches to ground,
wherein the voltage level down-shifting circuit further includes an output stage including an inverter connected to the intermediate node and the single output node, and
wherein the single output node is further connected to the first gate.

2. The structure of claim 1, wherein the capacitor includes a metal oxide semiconductor capacitor.

3. The structure of claim 1,
wherein the voltage level down-shifting circuit includes a total of four transistors,
wherein the first voltage is a first positive voltage and the second voltage is a second positive voltage lower than the first positive voltage,
wherein the first transistor and the second transistor are connected in series between a ground rail at 0.0 volts (V) and a positive supply voltage rail at the second positive voltage,
wherein the inverter includes a third transistor and a fourth transistor connected in series between the ground rail and the positive supply voltage rail, and
wherein a third gate of the third transistor and a fourth gate of the fourth transistor are connected to the intermediate node.

4. The structure of claim 3, wherein the second transistor is larger than all other transistors in the voltage level down-shifting circuit including the first transistor, the third transistor, and the fourth transistor.

5. The structure of claim 3, wherein the first transistor, the second transistor, and the third transistor are N-type field effect transistors and wherein the fourth transistor is a P-type field effect transistor.

6. The structure of claim 1, wherein all transistors within the voltage level down-shifting circuit are rated at the second voltage.

7. The structure of claim 1, wherein the first voltage is 3.6 volts (V) and the second voltage is 1.8 V.

8. A structure comprising:

a voltage level down-shifting circuit with a total of four dual-gated transistors, wherein the voltage level down-shifting circuit is connected to receive a voltage input signal at a single input node and operable to output an output voltage signal at a single output node, wherein the voltage input signal switches between a first voltage and ground and the output voltage signal switches between a second voltage that is less than the first voltage and ground, wherein the voltage level down-shifting circuit includes a single input stage including:

a first transistor having a first front gate;

a second transistor having a second front gate, wherein the first transistor and the second transistor are connected in series;

an intermediate node between the first transistor and the second transistor;

the single input node further connected to the second front gate; and a capacitor connected to the single input node and to the intermediate node, wherein the capacitor pulls down an intermediate voltage signal on the intermediate node from the second voltage to ground when the input voltage signal switches to ground, wherein the voltage level down-shifting circuit further includes an output stage including an inverter connected to the intermediate node and the single output node, and wherein the single output node is connected to the first front gate.

9. The structure of claim 8, wherein the capacitor is a metal oxide semiconductor capacitor.

10. The structure of claim 8, wherein the first transistor and the second transistor are connected in series between a ground rail at 0.0 volts (V) and a positive supply voltage rail at the second voltage, wherein the first transistor further includes a first back gate and the second transistor further includes a second back gate, wherein the inverter includes:

a third transistor having a third front gate and a third back gate; and a fourth transistor having a fourth front gate and a fourth back gate, wherein the third transistor and the fourth transistor are connected in series between the ground rail and the positive supply voltage rail, wherein the third front gate and the fourth front gate are connected to the intermediate node, wherein the first back gate, the second back gate, and the third back gate are connected to the ground rail, and wherein the fourth back gate is connected to the positive supply voltage rail.

11. The structure of claim 10, wherein the second transistor is larger than all other transistors in the voltage level down-shifting circuit including the first transistor, the third transistor, and the fourth transistor.

12. The structure of claim 10, wherein the first transistor, the second transistor, and the third transistor are N-type field effect transistors and wherein the fourth transistor is a P-type field effect transistor.

13. The structure of claim 12, wherein the first transistor, the second transistor, the third transistor, and the fourth transistor are semiconductor-on-insulator field effect transistors with the N-type field effect transistors being above at least one N-type well region in a semiconductor substrate and with the P-type field effect transistor being above a P-type well region in the semiconductor substrate.

14. The structure of claim 8, wherein all transistors within the voltage level down-shifting circuit are rated at the second voltage.

15. The structure of claim 8, wherein the first voltage is 3.6 volts (V) and the second voltage is 1.8 V.

16. A structure comprising:

a voltage level down-shifting circuit with a total of four dual-gated transistors, wherein the voltage level down-shifting circuit is connected to receive a voltage input signal at a single input node and operable to output an output voltage signal at a single output node, wherein the voltage input signal switches between a first positive voltage and ground and the output voltage signal switches between a second positive voltage that is less than the first positive voltage and ground, wherein the voltage level down-shifting circuit includes a single input stage including:

a first N-type field effect transistor (NFET) having a first front gate;

a second NFET having a second front gate, wherein the first NFET and the second NFET are connected in series between a ground rail and a positive supply voltage rail;

an intermediate node between the first NFET and the second NFET;

the single input node further connected to the second front gate; and a capacitor connected to the single input node and the intermediate node, wherein the capacitor pulls down an intermediate voltage signal on the intermediate node from the second positive voltage to ground when the input voltage signal switches to ground, wherein the voltage level down-shifting circuit further includes an output stage including an inverter, wherein the inverter includes:

a third NFET having a third front gate connected to the intermediate node;

a P-type field effect transistor (PFET) having a fourth front gate connected to the intermediate node, wherein the third NFET and the PFET are connected in series between the ground rail and the positive supply voltage rail; and the single output node between the third NFET and the PFET, and wherein the single output node is further connected to the first front gate.

17. The structure of claim 16, wherein the capacitor is a metal oxide semiconductor capacitor.

18. The structure of claim 16, wherein a first back gate of the first NFET, a second back gate of the second NFET, and a third back gate of the third NFET are connected to the ground rail, and wherein a fourth back gate of the PFET is connected to the positive supply voltage rail.

19. The structure of claim 16, wherein the second NFET is larger than all other transistors in the voltage level down-shifting circuit including the first NFET, the third NFET, and the PFET.

20. The structure of claim 16, wherein the first NFET, the second NFET, and the third NFET, are semiconductor-on-insulator field effect transistors above at least one N-type well region in a semiconductor substrate and wherein the PFET is a semiconductor-on-insulator field effect transistor above a P-type well region in the semiconductor substrate.

* * * * *